United States Patent
Bae

(10) Patent No.: US 8,629,033 B2
(45) Date of Patent: Jan. 14, 2014

(54) METHOD FOR MANUFACTURING SEMICONDUCTOR DEVICE

(75) Inventor: Byung Wook Bae, Icheon-si (KR)

(73) Assignee: Hynix Semiconductor Inc., Icheon (KR)

( * ) Notice: Subject to any disclaimer, the term of this patent is extended or adjusted under 35 U.S.C. 154(b) by 36 days.

(21) Appl. No.: 13/347,553

(22) Filed: Jan. 10, 2012

(65) Prior Publication Data

US 2013/0078782 A1   Mar. 28, 2013

(30) Foreign Application Priority Data

Sep. 23, 2011  (KR) .......................... 10-2011-0096347

(51) Int. Cl.
*H01L 21/02* (2006.01)

(52) U.S. Cl.
USPC ........... 438/381; 257/306; 257/307; 257/308; 257/309; 257/532

(58) Field of Classification Search
USPC ................. 438/243, 253, 254, 393, 397, 381
See application file for complete search history.

(56) References Cited

U.S. PATENT DOCUMENTS

| | | | |
|---|---|---|---|
| 2004/0084709 A1 | 5/2004 | Kim et al. | |
| 2005/0118779 A1 | 6/2005 | Ahn | |
| 2006/0113575 A1* | 6/2006 | Jang et al. | 257/296 |
| 2008/0003741 A1* | 1/2008 | Park et al. | 438/238 |
| 2010/0327410 A1* | 12/2010 | Park et al. | 257/534 |
| 2012/0175734 A1* | 7/2012 | Sohn | 257/532 |

FOREIGN PATENT DOCUMENTS

| | | | | |
|---|---|---|---|---|
| KR | 10-2004-0011837 A | | 2/2004 | |
| KR | 10-2005-0051957 A | | 6/2005 | |
| KR | 10-2010-0044558 A | | 4/2010 | |
| KR | 10-2011-0002353 | * | 1/2011 | ............ H01L 27/108 |

* cited by examiner

*Primary Examiner* — Chuong A Luu
*Assistant Examiner* — Rodolfo Fortich

(57) ABSTRACT

A method for manufacturing a semiconductor device prevents a lower electrode from leaning, in a dip-out process of an interlayer insulation film forming a lower electrode. A conductive material of a lower electrode is used as a support layer instead of a conventional nitride film support layer. This prevents a crack from being generated in a nitride film support layer. A method for manufacturing the semiconductor device is also disclosed.

18 Claims, 6 Drawing Sheets

METHOD FOR MANUFACTURING SEMICONDUCTOR DEVICE

CROSS-REFERENCE TO RELATED APPLICATION

The priority of Korean patent application No. 10-2011-0096347 filed on 23 Sep. 2011, the disclosure of which is hereby incorporated in its entirety by reference, is claimed.

BACKGROUND OF THE INVENTION

Embodiments of the present invention relate to a method for manufacturing a semiconductor device, and more particularly to a method for forming a semiconductor device including a storage node.

In general, a Dynamic Random Access Memory (DRAM) cell includes a capacitor for storing charges indicating information to be stored and a transistor for addressing the charges stored in the capacitor. Typically, a transistor formed over a semiconductor substrate includes a gate electrode for removing a current flowing in a source/drain region. Charges stored in the capacitor can be accessed through the transistor.

Storage capacity of the charges stored in the capacitor is called capacitance. As capacitance increases, a larger amount of information can be stored in the capacitor.

The capacitance can be represented by the following equation (1).

$$C = \epsilon A/D \qquad (1)$$

In this case, '$\epsilon$' is permittivity (or the dielectric constant) determined by a type of a dielectric film disposed between two electrodes, 'd' is a distance from one electrode to the other electrode, and 'A' is an effective surface area of the two electrodes. As can be seen from Equation (1), as permittivity ($\epsilon$) of the dielectric film is increased and the distance (d) between two electrodes is reduced, a surface area (A) of the two electrodes is increased such that capacitance of the capacitor can also be increased.

In this case, '$\epsilon$' is permittivity (or the dielectric constant), A is an effective surface area of an electrode, and 'd' is a distance from one electrode to the other electrode. Therefore, in order to increase capacitance of the capacitor, the surface area of each electrode can be increased, thickness of a dielectric thin film can be reduced, or permittivity of the dielectric thin film can be increased. In order to increase the effective area of the electrode, the electrode structure of the capacitor is modified into a three-dimensional (3D) structure, for example, a concave structure, a cylindrical structure, etc.

In order to form the concave capacitor, a hole, in which a capacitor electrode is to be formed, is formed in an interlayer insulation film, a lower electrode of the capacitor is formed on an inner surface of the hole, and a dielectric film and an upper electrode are deposited over the lower electrode, such that the concave capacitor can be formed. As the semiconductor device is highly integrated, it is difficult for the concave capacitor to guarantee sufficient capacitance required for each cell within a limited cell region. Therefore, a cylindrical capacitor capable of providing a surface area larger than that of the concave capacitor has recently been proposed.

In order to form the cylindrical capacitor, a hole, in which a capacitor electrode is to be formed, is formed in an interlayer insulation film, and a lower electrode of the capacitor is formed in the hole, the interlayer insulation film is removed, and a dielectric film and an upper electrode are deposited over the remaining lower electrode, such that the cylindrical capacitor can be formed. The cylindrical capacitor may use both of the inside and outside of the lower electrode as an effective surface area of the capacitor, such that it has higher capacitance than the concave capacitor.

A dip-out process is may be used for the formation of the cylindrical capacitor.

However, the dip-out process is carried out by a wet process including a chemical solution. The chemical solution may unavoidably generate slanting or leaning of the storage-node lower electrode. Specifically, if there is a high aspect ratio of the storage-node lower electrode due to higher integration of the semiconductor device, slanting and leaning of the lower electrode are considered to be serious problems. In recent times, in order to overcome the above-mentioned problems, a nitride film support layer between lower electrodes has been used.

However, since various kinds of materials are formed in the vicinity of the nitride film support layer, a crack occurs in the nitride film support layer due to unbalanced stress between different materials. Due to such crack, defective products continuously occur upon completion of a package fabrication, resulting in reduction in product quality.

BRIEF SUMMARY OF THE INVENTION

Various embodiments of the present invention are directed to providing a method for manufacturing a semiconductor device that substantially obviates one or more problems in the related art.

Embodiments of the present invention relate to a method for manufacturing a semiconductor device to prevent a lower electrode from leaning, in a dip-out process of an interlayer insulation film forming the lower electrode. In the semiconductor device, the conductive material of a lower electrode is used as a support layer instead of a conventional nitride film support layer. This can prevent a crack from being generated in a nitride film support layer.

In accordance with an embodiment of the present invention, a method for manufacturing a semiconductor device includes forming a sacrificial insulation film defining a storage node region over a semiconductor substrate; forming a first conductive material over the entirety of the semiconductor substrate including the sacrificial insulation film; etching the first conductive material formed over the sacrificial insulation film and an upper part of the sacrificial insulation film so as to form a hole for exposing the sacrificial insulation film, wherein the first conductive material remains at both sides of the hole; removing the sacrificial insulation film; forming a dielectric film over the first conductive material; forming a second conductive material over the entirety of the semiconductor substrate including the dielectric film; forming a capping film pattern exposing the second conductive material of the storage node region over the first conductive material, the dielectric film, and the second conductive material; and forming a third conductive material coupled to the second conductive material over the second conductive material and the capping film pattern.

The removing of the sacrificial insulation film may be carried out using a wet process utilizing an HF or BOE-based etchant. The etchant may be received through the hole.

The method may further include planarizing the first conductive material and the second conductive material until the first conductive material located at both sides of the hole is removed, thereby forming a lower electrode.

Each of the first conductive material, the second conductive material, and the third conductive material may be formed of any one of a titanium (Ti) film, a titanium nitride (TiN) film, a ruthenium (Ru) film, and a combination thereof.

The method may further include, after the formation of the third conductive material coupled to the second conductive material, forming an upper electrode by planarizing the third conductive material.

The first conductive material located at both sides of the hole may be used as a support layer in the process of removing the sacrificial insulation film. When forming the second conductive material, the second conductive material may be buried in both of the inside and outside of the first conductive material.

The capping film pattern may be formed of a material including an oxide film.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

FIGS. 1 to 11 are cross-sectional views illustrating a method for forming a semiconductor device according to embodiments of the present invention.

Figure 1:
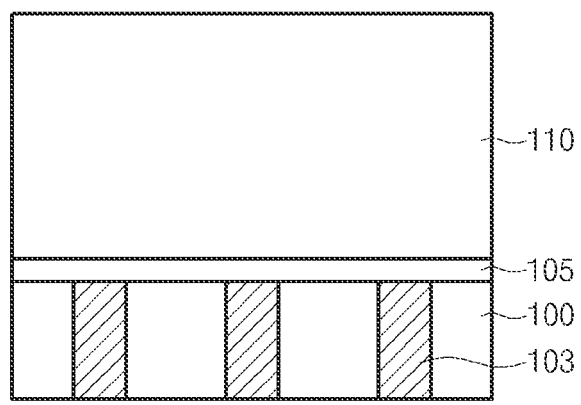
FIGS. 1 to 11 are cross-sectional views illustrating a method for forming a semiconductor device according to embodiments of the present invention.

Referring to FIG. 1, an interlayer insulation film 100 is formed over a semiconductor substrate (not shown) which may include a lower structure such as a gate electrode, a landing plug contact, etc. The interlayer insulation film 100 is etched so that a storage node contact hole (not shown) exposing a lower landing plug contact is formed.

A conductive material is formed over the entire surface including a storage node contact hole (not shown) A planarization etching process is performed until the interlayer insulation film 100 is exposed, such that the storage node contact plug 103 is formed. A conductive material formed within the storage node contact hole (not shown) may include polysilicon.

Thereafter, an etch stop layer 105 is formed over the storage node contact plug 103 and the interlayer insulation film 100. The etch stop layer 105 may be formed of a nitride film. The etch stop layer 105 adjusts the degree of etching in a subsequent etching process for forming a storage node region, so that it can prevent the storage node contact plug 103 from being damaged. In certain embodiments, an over-etch process may form the storage node region using the selection ratio between the nitride film acting as the etch stop layer 105, and the polysilicon layer acting as the storage node contact plug 103.

Subsequently, a sacrificial insulation film 110 is formed over the etch stop layer 105. The sacrificial insulation film 110 may be formed of a material including an oxide film. The sacrificial insulation film 110 may be formed of any one of a Phospho-Silicate-Glass (PSG) oxide film, a Tetra-Ethyl-Ortho-Silicate (TEOS) oxide film, and a combination thereof.

Figure 2:
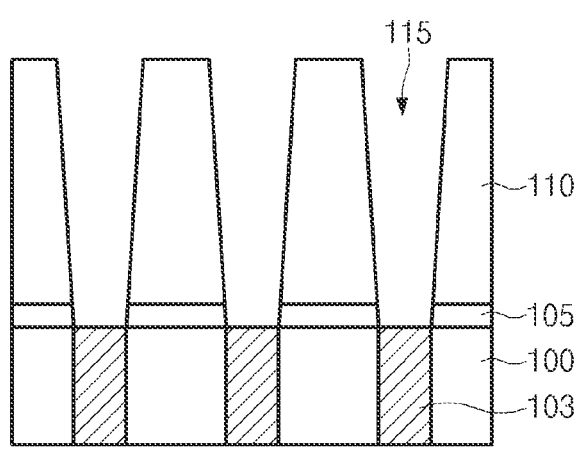

Referring to FIG. 2, a photoresist pattern (not shown) defining a storage-node scheduled region is formed over the sacrificial insulation film 110. The sacrificial insulation film 110 and the etch stop layer 105 are etched using the photoresist pattern (not shown) as an etch mask, so that a storage node region 115 exposing the storage node contact plug 103 is formed. In this case, the storage node region 115 may be wider than that of the storage node contact plug 103. Thereafter, the photoresist pattern (not shown) is removed.

Figure 3:
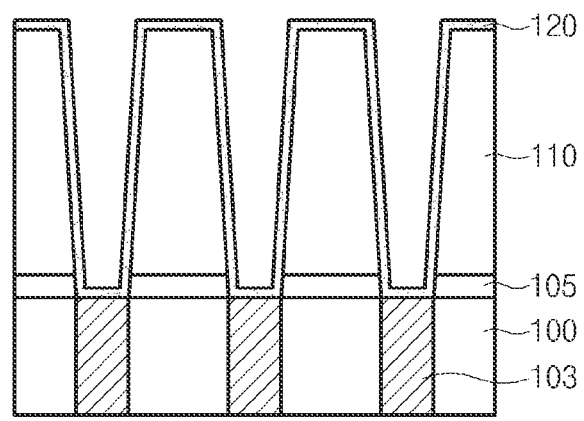

Referring to FIG. 3, a first conductive material 120 is deposited over the entirety of the sacrificial insulation film 110 including the storage node region 115. The first conductive material 120 may be formed of any one of a titanium (Ti) film, a titanium nitride (TiN) film, a ruthenium (Ru) film, and a combination thereof.

Figure 4:
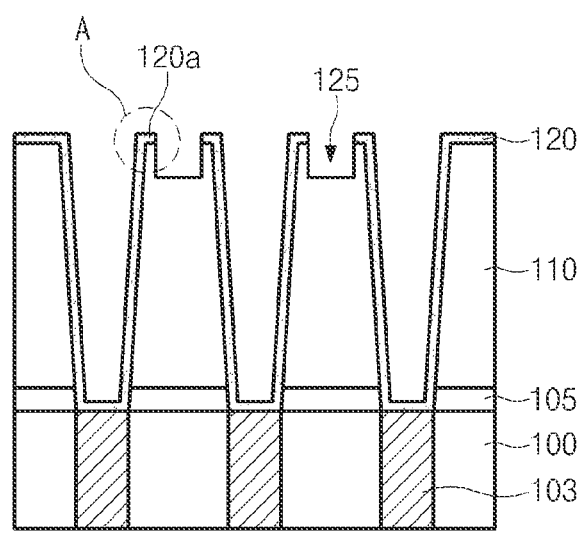

Referring to FIG. 4, a passivation film (not shown) is formed using a photoresist film, with the passivation film to be buried between the first conductive materials 120. A mask pattern (not shown) is formed over the passivation film (not shown) and the first conductive material 120. The mask pattern (not shown) may be formed to open a portion of the first conductive material 120 formed over the sacrificial insulation film 110.

Subsequently, upper parts of the first conductive material 120 and the sacrificial insulation film 110 are etched using the mask pattern (not shown) as an etch mask, resulting in formation of a hole 125 into which a wet solution can be inserted in a subsequent dip-out process. In this case, the hole 125 may be formed at the center part of the sacrificial insulation film 110, and may be minimized in size within a range into which the wet solution can be inserted. The hole 125 may be smaller than a full length of the sacrificial insulation film to allow the remaining first conductive material 120 (See the part "A") located at both sides of the hole 125 to be used as a support layer 120a for supporting the first conductive material 120 in the dip-out process.

Figure 5:
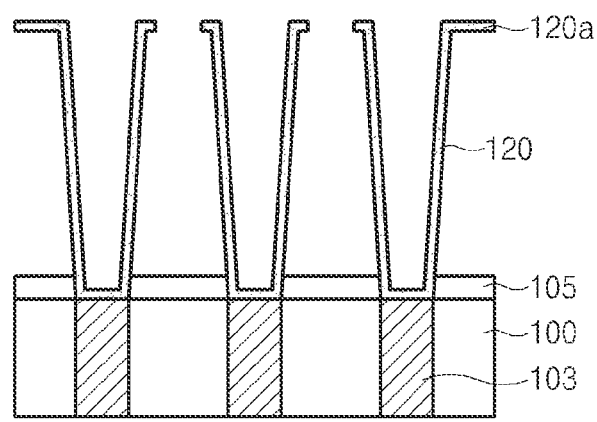

Referring to FIG. 5, a mask pattern (not shown) and a passivation film (not shown) are removed, and a wet solution is inserted into the hole 125 in such a manner that the dip-out process is performed.

The first conductive material 120 is thus separated from other materials by removing the sacrificial insulation film 110.

The dip-out process may be carried out by a wet process based on a chemical. The dip-out process may use an HF or Buffered Oxide Etch (BOE-based) etchant. In this case, the first conductive material 120 is prevented from leaning as a result of the dip-out process, owing to the presence of the support layer 120a such as the part "A".

Figure 6:
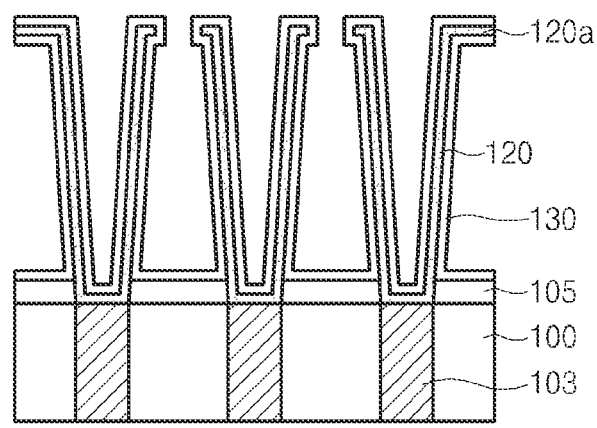

Referring to FIG. 6, a dielectric film 130 is formed over the first conductive material 120. The dielectric film 130 may be formed of any one of a TiO$_2$ film, a ZrO$_2$ film, a HFO$_2$ film, an Al$_2$O$_3$ film, a (Ba, Sr)TiO$_3$(BST) film, a SrBi$_2$Ta$_2$O$_9$ (SBT) film, and a combination thereof.

Figure 7:
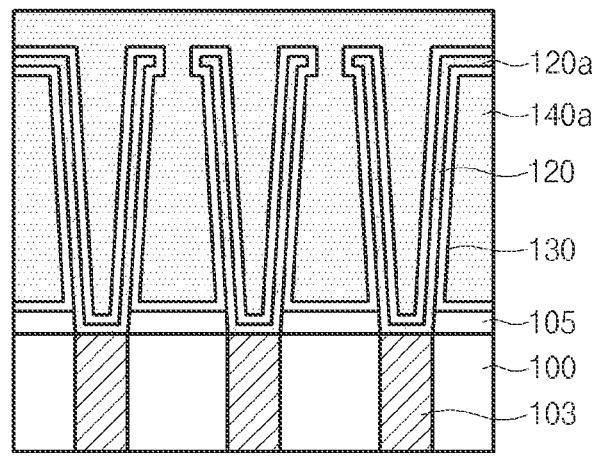

Referring to FIG. 7, a second conductive material 140a is formed over the surface including the dielectric film 130. The second conductive material 140a may be formed to bury both of the inside and outside of the first conductive material 120. In this case, the second conductive material 140a may be formed of any one of a titanium (Ti) film, a titanium nitride (TiN) film, a ruthenium (Ru) film, and a combination thereof.

Figure 8:
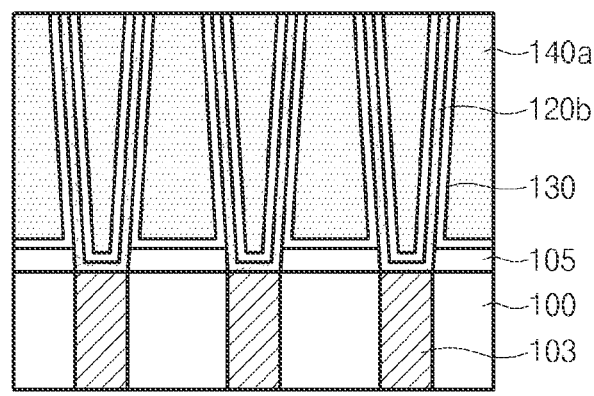

Referring to FIG. 8, a planarization process is performed until the support layer 120a of the first conductive material 120 is removed, such that a second conductive material 140a, a first conductive material 120, and a dielectric film 130 are removed by the planarization process. The planarization process may be performed by a Chemical Mechanical Polishing process or an etch-back process. In this case, the support layer 120a of the first conductive material 120 is removed, so that the lower electrode 120b of a cylindrical shape is configured in an isolated form.

Figure 9:
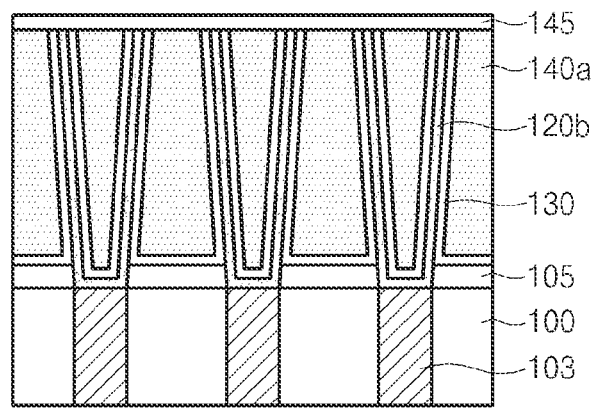

Referring to FIG. 9, a capping film 145 is formed over the lower electrode 120b, the dielectric film 130, and the second conductive material 140a. The capping film 145 may include an oxide film.

Figure 10:
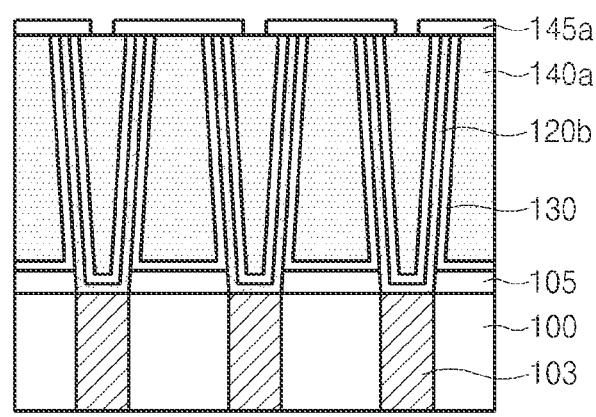

Referring to FIG. 10, the capping film 145 is etched so that a capping film pattern 145a partially exposing the second conductive material 140a in the lower cylindrical electrode 120b, is formed. The capping film pattern 145a may be formed at any position where the second conductive material 140a formed in the lower cylindrical electrode 120b, can be exposed. According to certain embodiments, the center part of the second conductive material 140a formed in the lower cylindrical electrode 120b is exposed.

Figure 11:
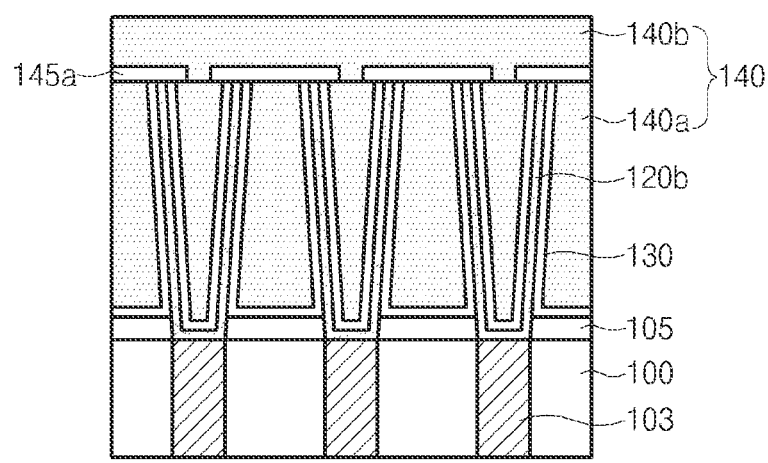

Referring to FIG. 11, a third conductive material 140b is formed over the second conductive material 140a and the capping film pattern 145a. The third conductive material 140b may be formed of the same materials as those of the second conductive material 140a. The third conductive material 140b may be formed of any one of a titanium (Ti) film, a titanium nitride (TiN) film, a ruthenium (Ru) film, and a combination thereof. In this case, the second conductive material 140a exposed by the capping film pattern 145a is coupled to the third conductive material 140b, so that a top or upper electrode 140 is formed.

As is apparent from the above description, embodiments provide methods for manufacturing a semiconductor device to prevent a lower electrode from leaning in a dip-out process of an interlayer insulation film forming the lower electrode. In the corresponding semiconductor device, a conductive material of a lower electrode is used as a support layer, instead of a conventional nitride film support layer. This prevents a crack from being generated in a nitride film support layer.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device comprising:
    forming a sacrificial insulation film defining a storage node region over a semiconductor substrate having a storage node contact plug;
    defining a storage node region within the sacrificial insulation film, the storage node region being provided over the storage node contact plug and having a sidewall extending from an upper surface to a lower surface of the sacrificial insulation film;
    forming a first conductive material for forming a lower electrode over the sacrificial insulation film and a sidewall of the storage node region;
    etching a part of the first conductive material formed over an upper part of the sacrificial insulation film and the upper part of the sacrificial insulation film to form a hole in the sacrificial insulation film without etching away the first conductive material provided over the sidewall of the storage node region;
    removing the sacrificial insulation film remaining below the hole so that the semiconductor substrate is substantially free of the sacrificial insulation film;
    forming a dielectric film conformally over the first conductive material;
    forming a second conductive material over the dielectric film;
    forming a capping film pattern over the first conductive material, the dielectric film, and the second conductive material, the capping film pattern having an opening to expose the second conductive material of the storage node region; and
    forming a third conductive material over the second conductive material and the capping film pattern, the third conductive material being coupled to the second conductive material via the opening of the capping film pattern.

2. The method according to claim 1, wherein the removing the sacrificial insulation film is carried out using a wet process utilizing an HF or BOE-based etchant.

3. The method according to claim 2, wherein the etchant is provided into the hole.

4. The method according to claim 1, further comprising:
    planarizing the first conductive material and the second conductive material until the first conductive material located at a side of the hole is removed, thereby forming a lower electrode.

5. The method according to claim 4, wherein the planarizing comprises a chemical mechanical polishing process or etch back process.

6. The method according to claim 1, wherein each of the first conductive material, the second conductive material, and the third conductive material is formed of any one of a titanium (Ti) film, a titanium nitride (TiN) film, a ruthenium (Ru) film, and a combination thereof.

7. The method according to claim 1, further comprising:
    after the formation of the third conductive material coupled to the second conductive material,
    forming an upper electrode by planarizing the third conductive material.

8. The method according to claim 1, wherein the first conductive material located at a side of the hole is used as a support layer in the process of removing the sacrificial insulation film.

9. The method according to claim 1, wherein:
    when forming the second conductive material, the second conductive material is buried in both an inside and an outside of the first conductive material.

10. The method according to claim 1, wherein the capping film pattern is formed of a material including an oxide film.

11. The method according to claim 1, wherein etching the first conductive material results in an amount of the first conductive material remaining on both sides of the hole.

12. The method according to claim 1, wherein forming the dielectric film comprises forming a TiO2 film, a ZrO2 film, a HFO2 film, an Al2O3 film, a (Ba, Sr)TiO3 (BST) film, a SrBi2Ta2O9 (SBT) film, or a combination thereof.

13. A method for forming a capacitor in a semiconductor device, the method comprising:
    providing a substrate having a storage node region defined within a sacrificial layer, the storage node region extending through the sacrificial layer and having a sidewall;
    forming a first conductive material for forming a lower electrode over the sacrificial layer and the storage node region, the first conductive material including a vertical portion provided over the sidewall of the storage node region and a horizontal portion provided over an upper portion of the sacrificial layer;
    etching a part of the horizontal portion of the first conductive material and the upper portion of the sacrificial layer to form a hole in the sacrificial layer and define a support layer, the support layer being the horizontal portion of the first conductive material remaining from etching;

introducing an etchant through the hole to remove the sacrificial layer while the support layer provides physical support to maintain a shape of the first conductive material;

forming a dielectric film over at least the vertical portion of the first conductive material; and forming a second conductive material over the dielectric film.

14. The method according to claim 13, further comprising:

removing the second conductive material and the support layer of the first conductive material so that the vertical portion of the first conductive material remains, wherein the vertical portion of the first conductive material, the dielectric film, and the second conductive material define a capacitor.

15. The method of claim 14, further comprising:

forming a capping film over the first conductive material, the dielectric film, and the second conductive material, the capping film contacting the first conductive material, the dielectric film and the second conductive material, and patterning an opening in the capping film to expose a portion of the second conductive material; and forming a third conductive material over the second conductive material and the patterned capping film, the third conductive material being coupled to the second conductive material via the opening of the patterned capping film.

16. The method according to claim 15 wherein removing the second conductive material comprises a chemical mechanical polishing process.

17. The method according to claim 15, wherein forming the dielectric film comprises forming a $TiO_2$ film, a $ZrO_2$ film, a $HFO_2$ film, an $Al_2O_3$ film, a $(Ba, Sr)TiO_3$ (BST) film, a $SrBi_2Ta_2O_9$ (SBT) film, or a combination thereof.

18. The method of claim 13, further comprising:

forming a capping film over the first conductive material, the dielectric film, and the second conductive material, and patterning an opening in the capping film to expose a portion of the second conductive material; and forming a third conductive material over the second conductive material and the patterned capping film, the third conductive material being coupled to the second conductive material via the opening of the patterned capping film.

* * * * *